US012513449B2

(12) United States Patent
Garnell et al.

(10) Patent No.: US 12,513,449 B2
(45) Date of Patent: Dec. 30, 2025

(54) NOISE CANCELING AUDIO HEADSET

(71) Applicant: DEVIALET, Paris (FR)

(72) Inventors: Emil Garnell, Paris (FR); Vu Hoang Co Thuy, Paris (FR)

(73) Assignee: DEVIALET, Paris (FR)

( * ) Notice: Subject to any disclaimer, the term of this patent is extended or adjusted under 35 U.S.C. 154(b) by 232 days.

(21) Appl. No.: 18/327,852

(22) Filed: Jun. 1, 2023

(65) Prior Publication Data

US 2024/0129659 A1 Apr. 18, 2024

(30) Foreign Application Priority Data

Jun. 3, 2022 (FR) ........................................ 2205379

(51) Int. Cl.
 *H04R 1/10* (2006.01)
(52) U.S. Cl.
 CPC .................................. *H04R 1/1083* (2013.01)
(58) Field of Classification Search
 None
 See application file for complete search history.

(56) References Cited

U.S. PATENT DOCUMENTS

| 2013/0343557 A1 | 12/2013 | Sontacchi et al. |
| 2016/0300562 A1 | 10/2016 | Goldstein |
| 2022/0189451 A1* | 6/2022 | Rui ............... G10K 11/1783 |

FOREIGN PATENT DOCUMENTS

| CN | 113891205 A | 1/2022 |
| WO | 2020142320 A1 | 7/2020 |

OTHER PUBLICATIONS

FR 2205379, INPI Rapport de Recherche Preliminaire, Jan. 11, 2023, 2 pages.

* cited by examiner

*Primary Examiner* — Kenny H Truong
(74) *Attorney, Agent, or Firm* — Soquel Group LLC

(57) ABSTRACT

The headset includes an electro-acoustic transducer, at least one noise reduction processing chain including external and internal microphones, a processing filter including mounted in parallel between the external microphone and an adder, at least one elementary filter each including a recursive filter and an elementary variable gain amplifier, a control unit for the gain of each elementary amplifier according to a signal coming from the external microphone and an error signal coming from the internal microphone.

The processing filter includes an open-loop main filter connected at the input to the external microphone and the output of which is connected, to the adder, and to the input of the or each elementary filter.

10 Claims, 5 Drawing Sheets

NOISE CANCELING AUDIO HEADSET

CROSS-REFERENCE TO RELATED APPLICATIONS

This application claims priority of French Patent Application No. 22 05379, filed on Jun. 3, 2022.

FIELD OF THE INVENTION

The present invention relates to an audio headset of the type including:
- an electro-acoustic transducer placed in a sound-reproduction cavity;
- at least one noise reduction processing chain comprising:
  - an external microphone for capturing ambient sound exterior to the cavity;
  - an internal microphone for capturing internal sound in the cavity;
  - a noise reduction processing filter for the signal coming from the external microphone, for producing an external noise reduction signal, where the noise reduction processing filter includes:
    - mounted in parallel between the external microphone and an adder at the output of which the external noise reduction signal is obtained, at least one elementary filter each including at least one recursive filter and each associated in series with an elementary variable gain amplifier;
    - a gain control unit for each elementary amplifier according to an external noise reduction target signal coming from the external microphone and an error signal coming from the internal microphone;
- means of amplification for the excitation of the electro-acoustic transducer, from at least the external noise reduction signal.

BACKGROUND OF THE INVENTION

In noise reduction processing chains using the external microphone signal for capturing ambient sound exterior to the cavity, the quality of the noise reduction processing depends very much on the isolation of the sound-reproduction cavity, and in particular on the tightness provided between the ear and the mechanical structure of the headset delimiting the cavity.

For taking into account, if appropriate, the leaks resulting from the fitting of the headset, it is known that the noise reduction processing filter is adaptive, so that the processing chain is modified over time.

For this purpose, it is known how to use Finite Impulse Response (FIR) filters which are easy to adapt. However, such filters cannot be implemented in a low latency process as in the case of a noise reduction system, the consequence being reduced performance in noise cancellation.

It is known, in such context, how to use recursive filters or Infinite Impulse Response (IIR) filters.

The use of such filters is described e.g. in document U.S. Pat. No. 9,549,249. In said document, a bank of IIR filters, each associated with a variable gain amplifier, is provided. Such filters are mounted in parallel. The inputs thereof are connected to the external microphone and the outputs thereof are summed for forming an external noise reduction signal. A control unit determines the gains applied to each filter, depending on the signals measured by the internal microphone and the external microphone.

At high frequencies, the signal measured at the internal microphone is different from the noise perceived at the eardrum. As a result, the proposed structure has the disadvantage of amplifying the high frequency noise at the eardrum when the algorithm minimizes the noise at the internal microphone. Such limit can be exceeded by reducing the bandwidth of the parallel filters, but the noise reduction is then also limited to the same bandwidth.

SUMMARY OF THE DESCRIPTION

The goal of the invention is to propose an audio headset having a noise reduction processing algorithm which is used for the adaptation of external noise reduction filters at low frequencies where the optimal filters exhibit the greatest variability, while maintaining a noise reduction performance at high frequencies.

To this end, the subject matter of the invention is an audio headset of the aforementioned type, characterized in that the noise reduction processing filter includes an open-loop main noise reduction processing filter connected at the input thereof to the external microphone and the output of which is connected, both to the adder at the output of which the external noise reduction signal is obtained, and to the input of the or each elementary filter.

According to particular embodiments, the audio headset includes one or a plurality of the following features:
- same includes means of calculating the error signal so that the error signal is a combination of the signal supplied by the internal microphone and the signal supplied by the external microphone multiplied by a compensation filter taking into account the pressure difference between the pressure at the internal microphone and the eardrum;
- same includes an input for an audio signal to be reproduced, connected at the input of the means of amplification, and same includes means of calculating the error signal so that the error signal is a combination of the signal supplied by the external microphone and the audio signal to be reproduced multiplied by a filter for estimating the corrected secondary path of a return loop of the secondary path, if the loop exists;
- same further includes a feedback loop for adding to the external noise reduction signal, at the input of the means of amplification, an internal noise reduction signal equal to the signal supplied by the internal microphone multiplied by a closed-loop noise reduction processing filter;
- same includes means of calculating the external noise reduction target signal connected to the output of the main open-loop noise reduction processing filter including an estimation filter for the secondary path;
- at least one of the means of calculating the external noise reduction target signal and the means of calculating the error signal includes means of sub-sampling, in order to reduce the calculation power needed;
- same includes means of measuring the energy of the external ambient sound and the gain control unit is suitable for restoring the gains of the different elementary filters to reference gains if the energy of the external ambient sound is below a predetermined threshold over a range of frequencies with an upper bound less than 2500 Hz;
- same includes a detector of voice activity or of spurious vibrations of the headset wearer and the gain control unit is suitable for blocking the gains of the different elementary filters if a voice activity or spurious vibrations of the headset wearer are detected;

same includes means of estimating the energy of the external ambient sound measured by the external microphone and the energy of the internal sound in the cavity measured by the internal microphone and the gain control unit is suitable for restoring the gains of the different elementary filters to reference gains if the energy of the internal sound is greater than the energy of the external ambient sound;

the elementary filters are filters the frequency response of which decreases for frequencies above 8000 Hz.

BRIEF DESCRIPTION OF THE DRAWINGS

The invention will be better understood upon reading the following description, given only as an example and making reference to the drawings, wherein.

DETAILED DESCRIPTION OF EMBODIMENTS

Figure 1:
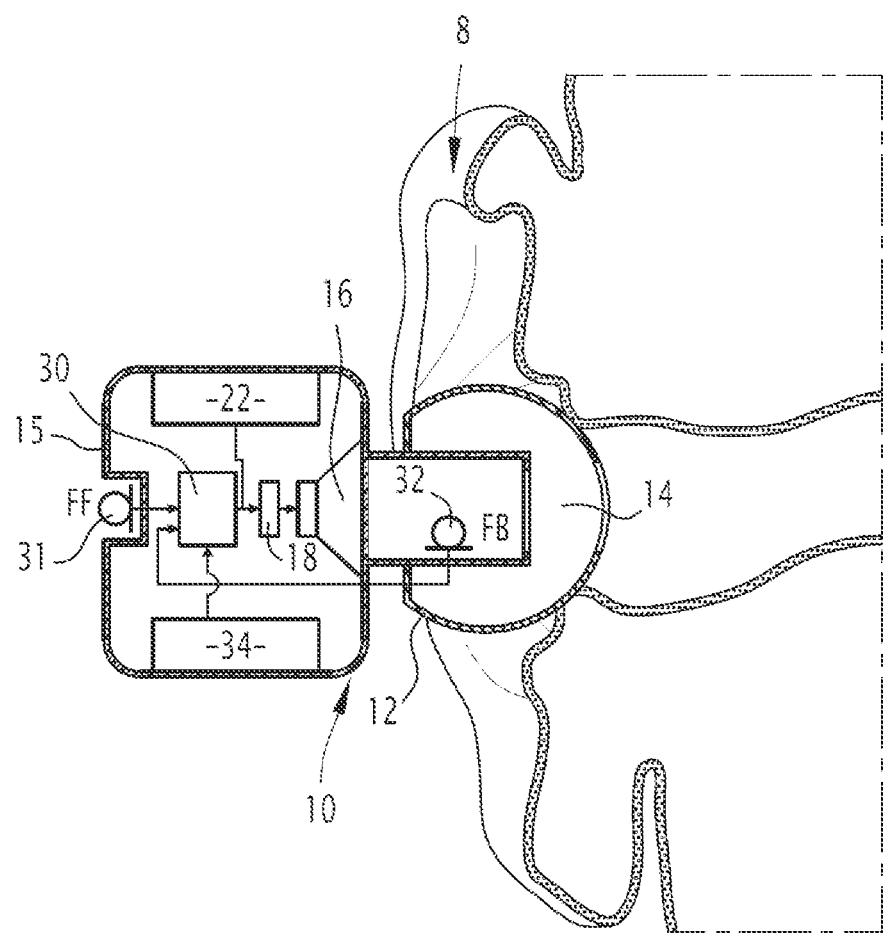
FIG. 1 is a schematic view of an audio headset according to the invention, placed in one ear.

FIG. 1 schematically shows an ear 8 wherein an audio headset 10 is partially inserted. In the example considered, the audio headset forms an earpiece suitable for being worn in one ear. The user has two earpieces, one for each ear. Only one earpiece will be described herein.

The earpiece includes, as is known per se, an end-piece 12 inserted into the ear canal. Such endpiece delimits a cavity 14 for sound reproduction. A case 15 extends the cavity outside the ear. As is known per se, such case receives the electronic components of the headset.

An electroacoustic transducer 16 is arranged in the cavity, facing the ear canal of the ear. The transducer is suitable for emitting a noise reduction signal into the cavity 14 and, if appropriate, and also for reproducing a sound signal such as music or voice.

In a variant, the cavity 14 is delimited by a shell covering most of the ear. The two shells are connected by a headband, so as to form an audio headset.

The transducer 16 is connected, for the excitation thereof, to an amplifier 18 which is assumed to have unity gain and which receives a digital signal to be reproduced through a digital-to-analog converter (not shown).

The headset has an input 22 for a musical signal to be reproduced. The input 22 consists e.g. of a Bluetooth or WIFI receiver suitable for receiving a digital sound signal.

The headset includes a noise reduction processing filter 30 the output of which is connected to the amplifier 18.

Furthermore, the headset includes an external microphone 31 suitable for picking up the ambient sound FF from outside the cavity 14. In a variant, same comprises a plurality of external microphones, the filter 30 is then duplicated for each external microphone.

The headset further includes an internal microphone 32 arranged in the cavity 14, for capturing the internal sound FB in the cavity. The internal microphone 32 is arranged in the axis of transmission of the transducer 16. The two microphones 31, 32 are connected to the noise reduction processing filter 30.

An accelerometer 34 is provided in the case of the earpiece, the accelerometer also being connected to the noise reduction processing filter 30.

Figure 2:
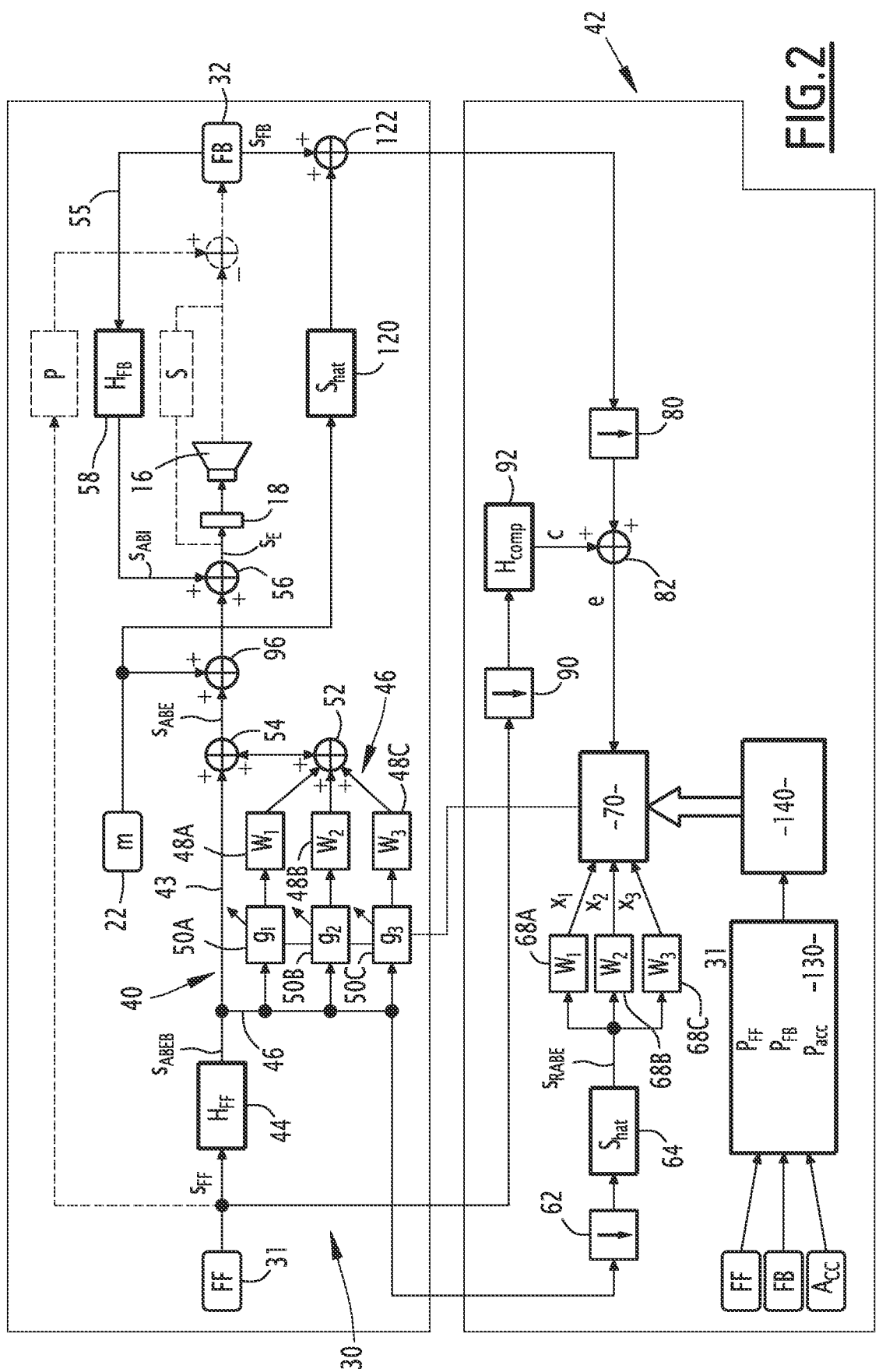
FIG. 2 is a block diagram of the headset showing the signal processing in the headset.

In FIG. 2, the elements of the headset illustrated in FIG. 1 have the same reference number. Thereby, one finds the two microphones, external 31 and internal 32, the transducer 16 connected to the amplifier 18. In FIG. 2, the secondary path between the output of the noise reduction processing filter 30 and the internal microphone 32 is denoted by the letter S.

Similarly, the primary path from the external microphone 31 to the internal microphone 32 is denoted by the letter P, same corresponds to the passive attenuation of the headset.

The primary and secondary paths are shown in dotted lines, since same do not correspond to a part of the electronic circuit but are part of the signal processing chain shown herein.

The noise reduction processing filter 30 includes an open-loop external noise reduction processing chain 40 including a set of noise reduction filters, some of which are associated with a variable gain amplifier and a control unit 42 for the gain of each elementary variable gain amplifier.

More precisely, the processing filter 30 includes a main branch 43 connecting the external microphone 31 to the amplifier 18. The branch 43 includes a static open-loop main filter 44 the transfer function of which is denoted by $H_{FF}$.

A shunt branch 46 is provided at the output of the main filter 44, including a bank of parallel elementary IIR filters 48A, 48B, 48C, e.g. three. The filter bank has a number of filters equal to or greater than one. Each of the elementary filters is connected at the input thereof to the output of the main filter 44 through a variable gain amplifier 50A, 50B, 50C with a gain denoted by $g_1$, $g_2$ and $g_3$, respectively.

The outputs of the elementary filters 48A, 48B, 48C are connected to an adder 52 which is as such connected to the output of the static main filter 44 on the main branch by an adder 54. An external noise reduction signal denoted by $s_{ABE}$ is obtained at the output of the adder 54.

Figure 3:
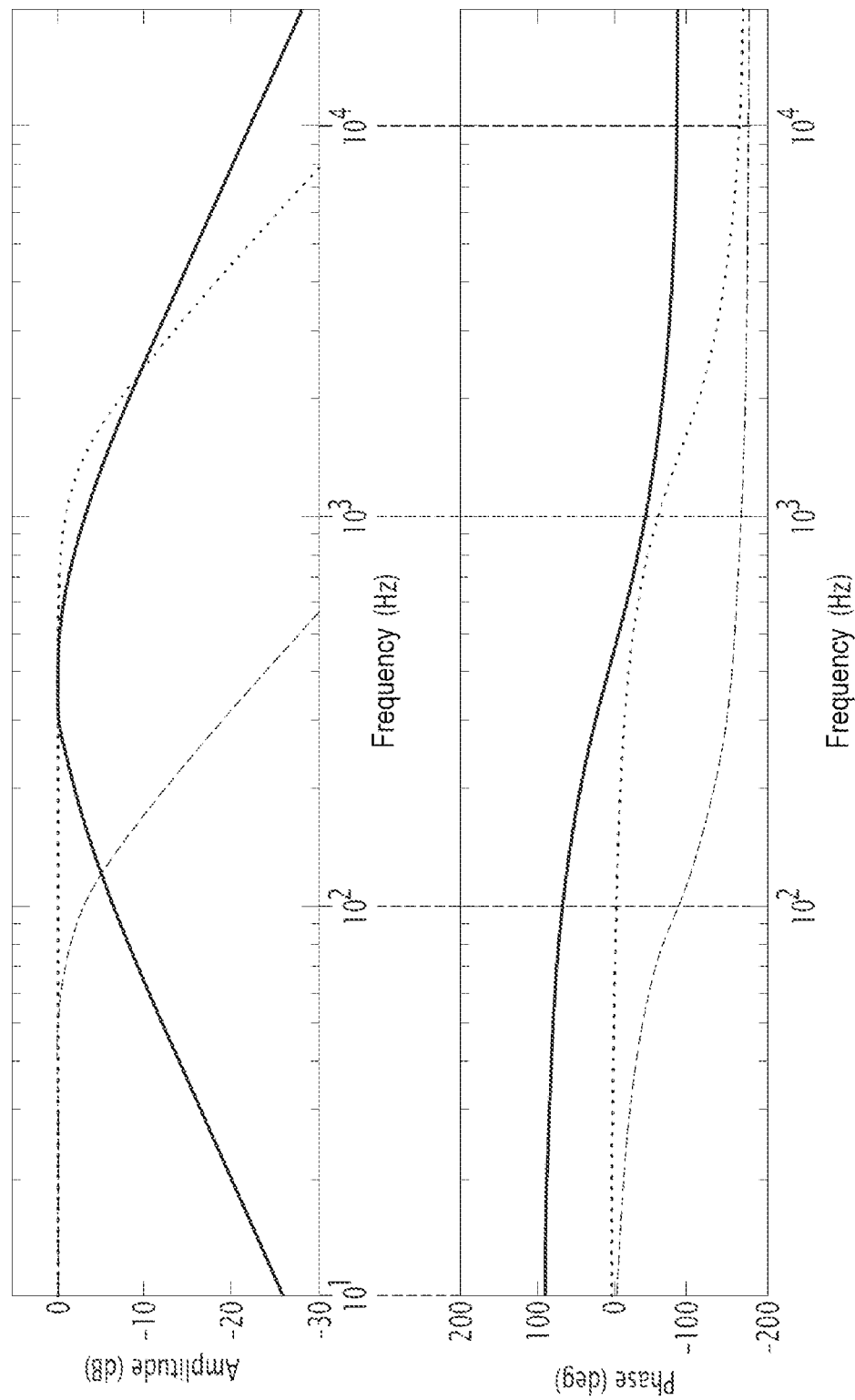
FIG. 3 is a combination of the characteristic curves for the amplitude and the phase as a function of the frequency of filters used in the headset.

The filters 48A to 48C are all filters, the frequency response of which decreases at high frequencies, typically above 2000 Hz for an earpiece and above 8000 Hz for a headset with a shell covering most of the ear. Same have a characteristic denoted by W1, W2, W3 as illustrated in FIG. 3 in the case of an earpiece.

In said figure, the characteristic W1 is shown with short dotted lines and the characteristic W2 is shown with long dotted lines and the characteristic W3 is shown with a solid line.

Thereby, in the example considered, the cut-off frequencies are 100 Hz, 500 Hz and 1000 Hz, respectively, for the elementary filters 48B, 48C and 48A.

The three elementary filters are designed for working in different frequency ranges, so that the total gain of the external noise reduction processing chain 40, grouping together the combined filters providing noise reduction processing, can modulate the static main filter 44 over the entire frequency range, potentially in different ways depending on the frequencies.

The elementary filters are designed so that a linear combination of the static main filter 44 and the elementary filters 48A, 48B, 48C models all the transfer functions of the optimal external noise reduction filter which depends on P and S, which can vary for the different conditions of use which could occur.

The filter formed by the external noise reduction processing chain 40 depends on the secondary path S and on the primary path P. Both the secondary path S and the primary path P can vary according to the placement of the earpiece in the ear, the shape of the ear canal, the level of leakage, etc. During design, for each combination of the primary path P and of the secondary path S, the optimal filter is calculated. The elementary filters are designed so that the difference between the optimal filter and the main filter 44 can be described with the elementary filters.

An internal noise reduction correction feedback loop 55 connects the internal microphone 32 to the output of the noise reduction filter 30 via an adder 56. The loop includes a static internal noise reduction filter 58 the transfer function f which is denoted by $H_{FB}$. Such filter, as is known per se, is chosen for maximizing the attenuation at the eardrum (by maximizing the amplitude thereof) while ensuring that the feedback loop remains stable. An internal noise reduction signal denoted $s_{ABI}$ is obtained at the output of the internal noise reduction filter 58.

Such filter is a feedback noise reduction filter which increases the perceived attenuation at the eardrum. In a variant, there is no internal noise reduction correction feedback loop 55.

The control unit 42 receives, as input, the raw external noise reduction signal denoted by $S_{ABEB}$ obtained at the output of the main filter 44. Such signal is sub-sampled by a sub-sampler 62, for switchings from a sampling frequency e.g. of 384 kHz to 8 kHz.

The signal thereby sub-sampled is sent to a filter 64 the transfer function of which denoted by $S_{hat}$ is an estimate of the transfer function between the signal which leaves the adder 96 and the signal measured by the external microphone 32.

The transfer function $S_{hat}$ is an estimate of the transfer function of the secondary path S with the internal noise reduction correction feedback loop 55.

It is defined by $S_{hat}=S/(1-SH_{FB})$ where S is the secondary path and $H_{FB}$ is the transfer function of the internal noise reduction filter.

Figure 4:
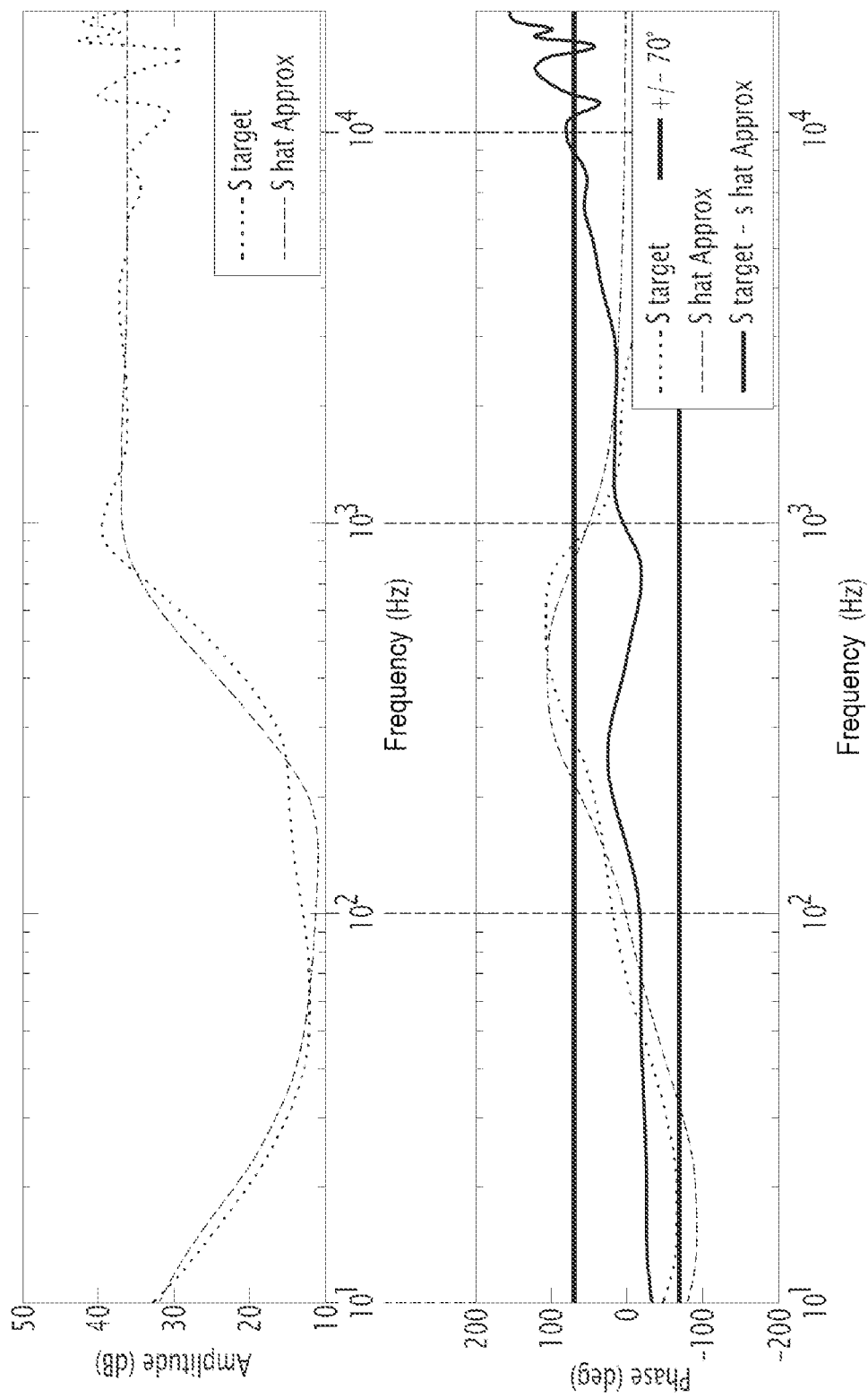
FIG. 4 is a combination of the characteristic curves for the amplitude and the phase as a function of the frequency of the transfer function Shat of the secondary path and of the noise reduction processing chain.

An estimate of $S_{hat}$ is obtained by fitting a series of bi-quad circuits to the above expression using transfer functions measured at the acoustic cavities as illustrated in FIG. 4 representing the amplitude and the phase of the transfer function whereas the static internal noise reduction filter 58 is active.

In said figure, the transfer function of the secondary path with the closed-loop noise reduction filter $S/(1-SH_{FB})$ is represented in short dotted lines, and the estimate of $S_{hat}$ adopted for the implementation is represented in long dotted lines.

The signal obtained at the output of the filter 64 forms an external noise reduction reference signal denoted by $S_{RABE}$. Such signal is addressed in 3 filters 68A, 68B, 68C identical to the filters 48A, 48B, 48C. The external noise reduction target signal thus filtered denoted by $x_1$, $x_2$, $x_3$ is addressed at the input of an adaptive gain calculation unit 70.

The adaptive gain calculation unit 70 also receives as input, an error signal e coming from the internal microphone 32.

To this end, the microphone 32 is connected to a sub-sampler 80 the output of which is connected to the calculation unit 70 through an adder 82.

The adder receives on the other input thereof, a correction signal c coming from the external microphone 31 and making it possible to transform the internal microphone 32 into a virtual microphone placed at the eardrum.

To this end, the microphone 31 is connected through a sub-sampler 90 to a compensation filter 92 with a transfer function denoted by $H_{comp}$.

Figure 5:
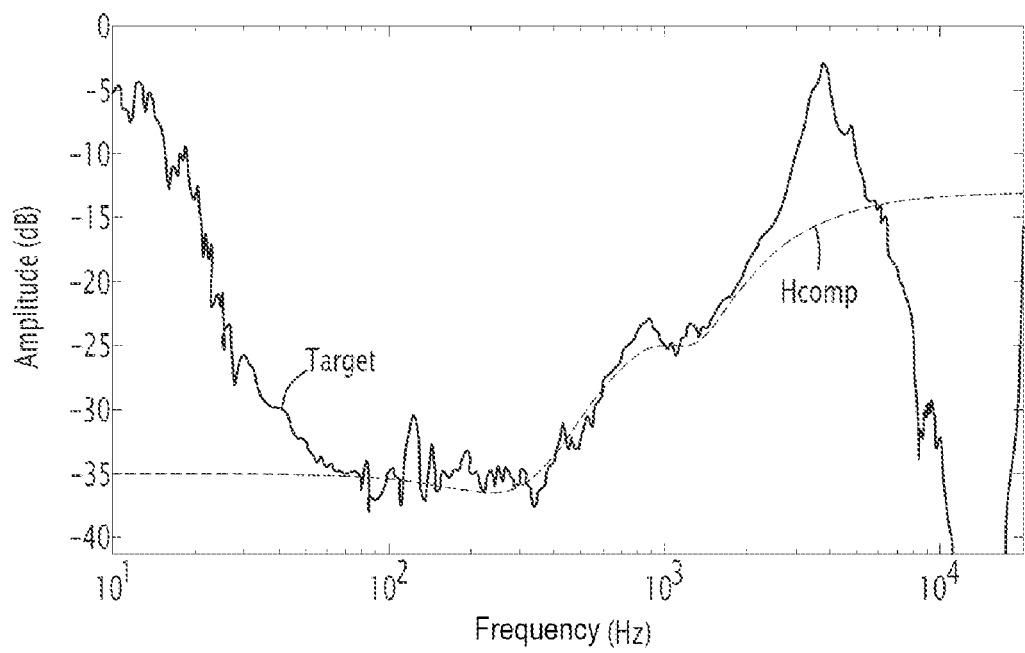
FIG. 5 is an amplitude curve of the transfer function of a compensation filter.

The compensation filter 92 is suitable for compensating the difference between the internal microphone 32 and the eardrum. The transfer function $H_{comp}$ thereof is e.g. such as illustrated in FIG. 5.

The target curve denote by Target is measured experimentally and is approximated by the transfer function $H_{comp}$.

On said curve, it can be seen that the compensation is high above 800 hertz. At low frequencies, the compensation is very small since the sound pressure at the internal microphone 32 and at the eardrum are very similar. Thereby, minimizing the error at the internal microphone 32 is equivalent to minimizing the error at the eardrum.

In the absence of a reproduced musical signal, the error e is expressed as $e=s_{FB}+H_{comp}*s_{FF}$, where $s_{FB}$ is the signal from the internal microphone 32;
$H_{comp}$ is the transfer function of the compensation filter 92;
$S_{FF}$ is the signal from the external microphone 31.

The input 22 for the audio signal to be reproduced is connected by an adder 96 to the main branch at the output of the noise reduction processing filter 30 so that the signal to be reproduced, the external noise reduction signal $S_{ABE}$ and the internal noise reduction signal $s_{ABI}$ are added for forming the excitation signal denoted by $s_E$ applied to the transducer 16 after amplification by the amplifier 18.

Advantageously, but optionally, an echo cancellation filter 120 with a transfer function equal to $S_{hat}$ receives at the input thereof, the signal to be reproduced, coming from the input 22, and is connected at the output of the microphone 32 by an adder 122 which adds up the internal signal $s_{FB}$ and the signal to be reproduced, filtered by the filter 120 before being applied to the adaptive gain calculation unit 70.

The unit 70 is connected to the variable gain amplifiers 50A, 50B, 50C so as to ensure the setting of the gain $g_1$, $g_2$, $g_3$ thereof by implementing a Least Mean Squares (LMS) algorithm.

The equations for updating the gains $g_1$, $g_2$, $g_3$ are given hereinbelow:

$$g_1 = g_1 + e\frac{\mu}{P_{x_1} + P_{x,min}}$$

$$g_2 = g_2 + e\frac{\mu}{P_{x_2} + P_{x,min}}$$

$$g_3 = g_3 + e\frac{\mu}{P_{x_3} + P_{x,min}}$$

where μ is the step of the least mean squares algorithm;
$x_i$ is the external noise reduction target signal filtered by the filter with the characteristic $W_i$;
$P_{x_i}$ is the signal strength $x_i$
$P_{x,min}$ is a set constant; and
e is the error signal coming from the adder 82.

In a variant, and for a faster convergence, a recursive least squares (RLS) algorithm is implemented by the unit 70.

Moreover, the external microphone 31, the internal microphone 32 and the accelerometer 34 are each connected to an input of an energy calculation unit 130 suitable for calculating energies used for the control of a convergence unit 140 which is connected as such to the adaptive gain calculation unit 70, so as to stop the adaptive calculation of the gains according to the calculated energy values.

The energy calculation unit 130 is suitable for calculating the energy of the external ambient sound picked up by the microphone 31 in the frequency range of 50 to 2000 hertz. Such energy is denoted by $P_{FF}$. Similarly, over the same frequency range, same is suitable for calculating an internal sound energy denoted by $P_{FB}$ corresponding to the energy of the signal picked up by the internal microphone 32.

Finally, same is suitable for calculating the acceleration energy denoted by $P_{acc}$, corresponding to the energy of the signal measured by the accelerometer 34 in the frequency band from 70 to 1500 Hertz.

From such calculated energies, the convergence control unit 140 is suitable for controlling the gain calculation unit 70.

For this purpose, the energy of the external ambient sound $P_{FF}$ is compared to a threshold. If the value of the energy of the external ambient sound $P_{FF}$ is lower than the threshold for a predetermined duration, e.g. one second, thereby reflecting that the external ambient sound is low, then the gains $g_1$, $g_2$, $g_3$ are set at predetermined reference values, without taking into account the algorithm for the evolution of the gains implemented by the unit 70 for calculating adaptive gains.

Similarly, if the energy of the internal sound $P_{FB}$ is much greater than the energy of the external ambient sound $P_{FF}$, e.g. by a ratio greater than 10, the gains $g_1$, $g_2$, $g_3$ are restored to initial reference values. The algorithm for defining the gains $g_1$, $g_2$, $g_3$ is restarted only when the energy of the internal sound $P_{FB}$ is no longer much greater than the energy of the external ambient sound $P_{FF}$.

Finally, if the acceleration energy $P_{acc}$, is greater than a threshold value, thereby reflecting vibrations of the user's skin representative of words spoken by the user or of spurious vibrations, the gains of the different elementary filters are blocked at the current gains and the algorithm for defining the gains is stopped until the acceleration energy $P_{acc}$, is less than the predetermined threshold value.

The invention claimed is:

1. An audio headset comprising:
   an electro-acoustic transducer placed in a sound-reproduction cavity; and
   at least one noise reduction processing chain, each comprising:
   an external microphone for capturing ambient sound exterior to the cavity;
   an internal microphone for capturing internal sound in the cavity;
   a noise reduction processing filter for a signal coming from said external microphone, for producing an external noise reduction signal, the noise reduction processing filter comprising:
   mounted in parallel between said external microphone and an adder at an output of which the external noise reduction signal is obtained, either (i) one elementary filter comprising at least one recursive filter and the elementary filter associated in series with an elementary variable gain amplifier, or (ii) at least two elementary filters mounted in parallel, each elementary filter comprising at least one recursive filter and each elementary filter associated in series with an elementary variable gain amplifier;
   a gain control unit for controlling the gain of each elementary variable gain amplifier according to an external noise reduction target signal coming from said external microphone and an error signal coming from said internal microphone; and
   an open-loop main noise reduction processing filter, the input of which is connected to said external microphone and the output of which is connected, both to the adder at the output of which the external noise reduction signal is obtained, and to the input of each elementary filter; and
   an amplifier for excitation of said electro-acoustic transducer, from at least the external noise reduction target signal.

2. The audio headset according to claim 1, further comprising a calculator calculating the error signal so that the error signal is a combination of a signal supplied by said internal microphone and of the signal supplied by said external microphone processed by a transfer function of a compensation filter taking into account the pressure difference between the pressure at said internal microphone and an eardrum.

3. The audio headset according to claim 1, further comprising:
   an input for an audio signal to be reproduced, connected at the input of said amplifier; and
   a calculator calculating the error signal so that the error signal is a combination of the signal supplied by said external microphone and an audio signal to be reproduced, processed by a transfer function of a filter for estimating a a secondary path, the secondary path being corrected by a return loop of the secondary path, when there is such a return loop.

4. The audio headset according to claim 1, further comprising a feedback loop for adding to the external noise reduction signal, at the input of said amplifier, an internal noise reduction signal equal to a signal provided by said internal microphone multiplied by a closed-loop noise reduction processing filter.

5. The audio headset according to claim 1, further comprising a calculator calculating the external noise reduction target signal connected to the output of the open-loop main noise reduction processing filter including a filter for estimating a secondary path.

6. The audio headset according to claim 1, wherein at least one of a calculator calculating the external noise control target signal and a calculator calculating the error signal comprises a sub-sampler for reducing calculation power needed.

7. The audio headset according to claim 1, further comprising a measurement unit measuring the energy of the external ambient sound, and wherein said gain control unit is suitable for restoring the gains of the different elementary filters to reference gains if the energy of the external ambient sound is less than a predetermined threshold over a frequency range with an upper bound less than 2500 Hz.

8. The audio headset according to claim 1, further comprising a detector of voice activity or of spurious vibrations of a wearer of the audio headset, and wherein said gain control unit is suitable for blocking gains of the different elementary filters if a voice activity or spurious vibrations of the wearer of the audio headset are detected.

9. The audio headset according to claim 1, further comprising an estimator estimating the energy of the external ambient sound measured by said external microphone and the energy of the internal sound in the cavity, measured by said internal microphone, and wherein said gain control unit is suitable for restoring gains of the different elementary filters to reference gains if the energy of the internal sound is greater than the energy of the external ambient sound.

10. The audio headset according to claim 1, wherein each elementary filter has a frequency response which decreases for frequencies above 8000 Hz.

\* \* \* \* \*